United States Patent
Ng

(10) Patent No.: US 7,800,236 B1
(45) Date of Patent: Sep. 21, 2010

(54) SEMICONDUCTOR DIE AND METHOD FOR FORMING A SEMICONDUCTOR DIE HAVING POWER AND GROUND STRIPS THAT ARE ORIENTED DIAGONALLY

(75) Inventor: Gary Ng, Campbell, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 207 days.

(21) Appl. No.: 11/935,241

(22) Filed: Nov. 5, 2007

Related U.S. Application Data

(60) Provisional application No. 60/892,243, filed on Feb. 28, 2007.

(51) Int. Cl.
*H01L 23/48* (2006.01)
(52) U.S. Cl. .................. 257/776; 257/773; 257/E23.07
(58) Field of Classification Search .................. 257/773, 257/776, E23.01, E23.07
See application file for complete search history.

(56) References Cited

U.S. PATENT DOCUMENTS

| | | | | |
|---|---|---|---|---|
| 7,086,024 B2 * | 8/2006 | Hsu et al. | ....................... | 716/8 |
| 7,462,941 B2 * | 12/2008 | Campbell et al. | ........... | 257/781 |
| 2003/0177466 A1 * | 9/2003 | Weekly | ....................... | 716/16 |
| 2003/0183419 A1 * | 10/2003 | Miller et al. | ................ | 174/261 |
| 2005/0023705 A1 * | 2/2005 | Campbell et al. | ........... | 257/786 |

FOREIGN PATENT DOCUMENTS

JP          64-15947 A  *  1/1989

\* cited by examiner

*Primary Examiner*—Allan R. Wilson
(74) *Attorney, Agent, or Firm*—Kenneth Glass; Glass & Associates

(57) ABSTRACT

A method for forming a semiconductor die and a flip-chip integrated circuit device are disclosed that include a power and ground mesh that is oriented diagonally. A layout of a semiconductor die is formed by generating a first integrated circuit design and copying and rotating the design so as to form three additional integrated circuit design blocks. The power and ground mesh layer includes four overlying sets of power and ground strips that are oriented diagonally and symmetric. Because the power and ground strips of the present invention are angled and correspond to the underlying integrated circuit design, they allow for powering both rotated and non-rotated logic while maintaining identical interconnection points and capacitive loading across all the repeated blocks. In addition, the angled power and ground strips allow for easily coupling power and ground to structures around the periphery of the power and ground strips.

9 Claims, 9 Drawing Sheets

SEMICONDUCTOR DIE AND METHOD FOR FORMING A SEMICONDUCTOR DIE HAVING POWER AND GROUND STRIPS THAT ARE ORIENTED DIAGONALLY

CROSS-REFERENCE TO RELATED APPLICATIONS

The present application claims benefit of U.S. Provisional Patent Application Ser. No. 60/892,243, filed Feb. 28, 2007, entitled "SEMICONDUCTOR DIE AND METHOD FOR FORMING A SEMICONDUCTOR DIE HAVING POWER AND GROUND STRIPS THAT ARE ORIENTED DIAGONALLY."

BACKGROUND

Description of Related Art

The physical implementation of a design containing repeatedly instantiated, logically identical subblocks can be challenging. Often the challenge is to preserve physical equivalence while simultaneously providing support for the non-repeated logic that surrounds and binds subblocks together. Moreover, efficiently supplying power and ground to all regions of the die can be difficult.

Conventional flip-chip integrated circuit devices include a mesh of alternating power and ground straps that run horizontally and vertically across the die to distribute power and ground to the transistors in the layers below.

For compatibility with signal routing algorithms, adjacent layers alternate between horizontal and vertical orientation. For example, if metal layers 1, 3, 5, and 7 carry horizontal routes, metal layers 2, 4, 6, and 8 will carry vertical routes, allowing routing algorithms to change direction by moving up or down one layer.

When constructing power mesh, this same alternation guarantees power and ground straps interleaved on one layer will intersect interleaved power and ground straps on adjacent layers, allowing the mesh to be connected by interlayer vias.

If straps on adjacent layers were to use the same orientation, the only way to establish interlayer connectivity is to purposefully stack straps so they overlap one another; non-overlapping parallel straps never cross and, therefore, do not provide opportunities to drop interlayer vias. Using the same metal orientation on adjacent layers is not desirable because it requires careful coordination, especially if power straps in subblocks must line up with straps in the top level.

Although the goal is to alternate orientation on adjacent layers for the reasons outlined above, this may not be feasible. For example, if signal route optimization forces multiple instantiations of rotated identical blocks to be placed within a field of non-rotated top level logic, there is no clear horizontal/vertical orientation established across the die.

There are sub-regions of uniform route orientation, but areas at the boundaries of an orientation switch contain both horizontal and vertical routes on a single layer of metal, making it difficult to match the top level and subblock level power grids. Traditional approaches customize subblock power mesh, giving up physical equivalence and the related advantages.

Accordingly, there is a need for a method and apparatus that effectively couples power and ground to high pin count flip-chip integrated circuit devices and that will allow for rotation of subblocks. Moreover there is a need for a method of forming a flip-chip integrated circuit device and a flip-chip integrated circuit device that will meet the above needs and that will reduce the time, storage and computer resources required to complete the design.

SUMMARY

A semiconductor die, a method for forming a semiconductor die and a method for forming an integrated device design are disclosed in which a power and ground mesh is used that includes power and ground strips that are oriented diagonally. The diagonal power and ground strips of the present invention allow for easily coupling to underlying structures independent of preferred routing direction. In addition, they allow for easily coupling to structures around the periphery of the power and ground strips.

In one embodiment a layout of a semiconductor die is formed by generating a first integrated circuit design and copying and rotating the design so as to form three additional integrated circuit design blocks. The power and ground mesh layer includes overlying sets of power and ground strips that symmetric and oriented diagonally. Because the power and ground strips of the present invention are angled and correspond to the underlying integrated circuit design, they allow for powering both rotated and non-rotated logic while maintaining identical interconnection points and capacitive loading across all the repeated blocks. In addition, the angled power and ground strips allow for easily coupling power and ground to structures around the periphery of the power and ground strips by providing access to both the power and ground signals.

In one embodiment the resulting design contains both rotated standard cell subblocks with non-preferred routing direction and standard cell logic with the preferred direction. The use of corresponding symmetric angled power and ground strips allows for powering both rotated and non-rotated logic while maintaining identical interconnection points and capacitive loading across all the repeated blocks. Moreover, the methods and apparatus of the present invention do not require that each rotated block be laid out and verified individually as is required in some conventional prior art methods.

Moreover, the diagonally-routed, symmetric power and ground mesh of the present invention simultaneously supplies identical, rotated blocks and surrounding non-rotated standard cell regions while maintaining rotationally invariant connections and loading. This is achieved despite the fact that the preferred routing direction if the underlying subblocks is non-uniform across the device.

Accordingly, the method and apparatus of the present invention allows for effectively coupling power and ground to flip-chip integrated circuit devices while allowing for rotation of subblocks. Moreover the method and apparatus of the present invention reduces the time, storage and computer resources required to complete the integrated circuit design. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
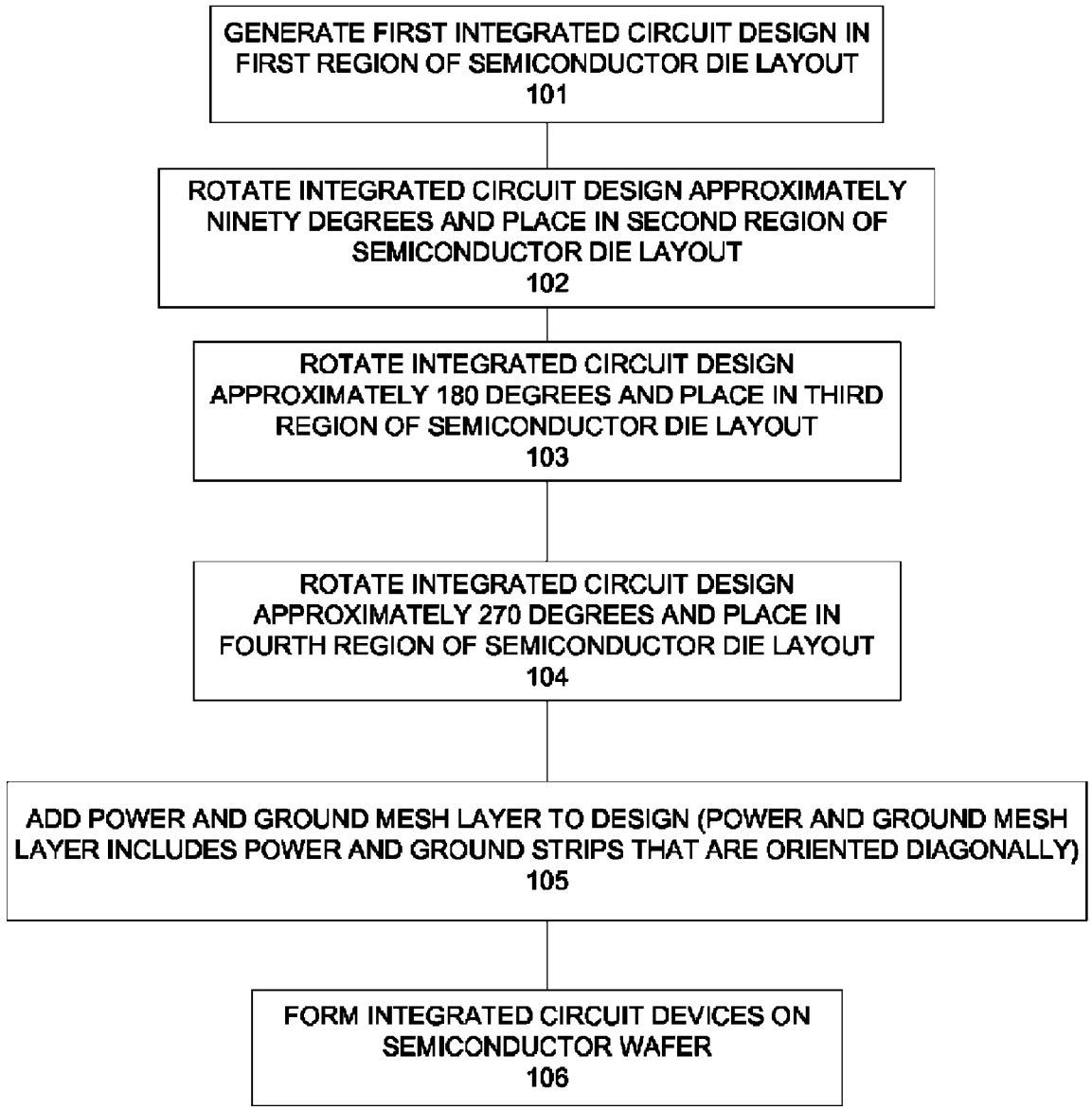
FIG. 1 illustrates a method for forming a semiconductor die in accordance with an embodiment of the present invention.
Figure 2:
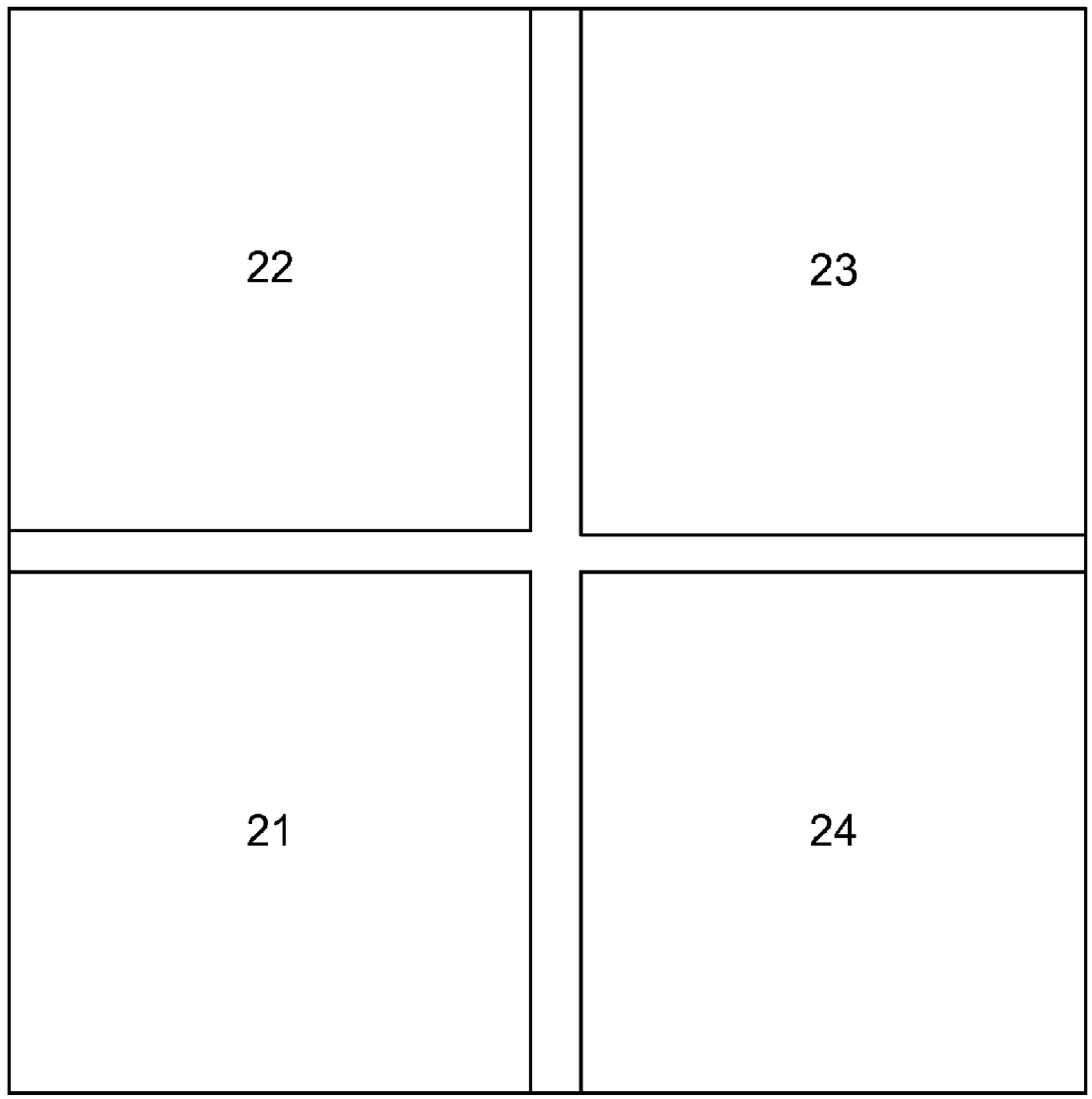
FIG. 2 is a top view of a flip-chip integrated circuit device layout that includes four regions in accordance with an embodiment of the present invention.
Figure 3:
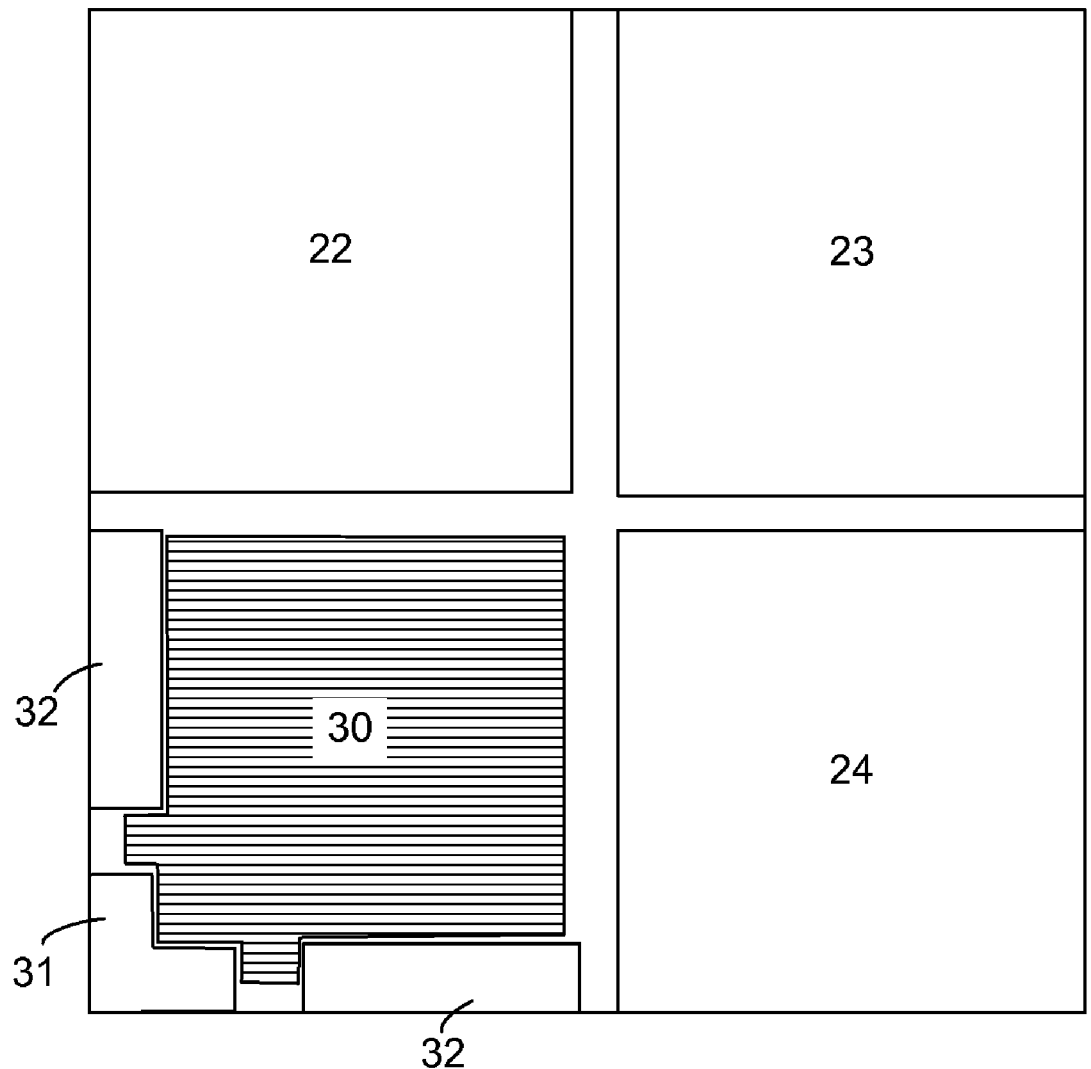
FIG. 3 is a top view of a flip-chip integrated circuit device layout that includes a first integrated circuit design and input and output regions in accordance with an embodiment of the present invention.

FIG. 1 shows a method for forming a semiconductor die in accordance with an embodiment of the present invention. As shown by step 101 an integrated circuit design is generated in a first region of the semiconductor die layout. In the embodiment shown in FIG. 2, the design includes four regions, shown as regions 21-24. The first region 21 is in the lower left corner of the semiconductor die layout; the second region 22 is above the first region 21; the third region is in the upper right corner of the semiconductor die layout; and the fourth region 24 is immediately below the third region 23. In the present embodiment the integrated circuit design contains both standard cell subblocks with non-preferred routing direction and standard cell logic with a preferred routing direction.

Referring to step 102 the integrated circuit design is rotated approximately ninety degrees and placed in the second region of the semiconductor die layout. In the embodiment shown in FIG. 2, the integrated circuit design is rotated and placed into second region 22. In the present embodiment the resulting design will now contain both rotated standard cell subblocks with non-preferred routing direction and standard cell logic with the preferred routing direction.

Referring now to step 103 the integrated circuit design is rotated approximately one hundred eighty degrees and placed in the third region of the semiconductor die layout. In the embodiment shown in FIG. 2, the integrated circuit design is rotated one hundred eighty degrees and is placed into third region 23.

As shown by step 104 the integrated circuit design is rotated approximately two hundred seventy degrees and placed in the fourth region of the semiconductor die layout. In the embodiment shown in FIG. 2, the integrated circuit design is rotated two hundred seventy degrees and is placed into fourth region 24.

FIGS. 3-6 show an embodiment in which an integrated circuit design 30 is generated in step 101. Integrated circuit design 30 can be generated using cells from a standard cell library. In the present embodiment the semiconductor die layout includes input and output regions 31 and 32. The layout of input and output regions 31 and 32 are generated so as to provide for input and output to integrated circuit design 30.

Figure 4:
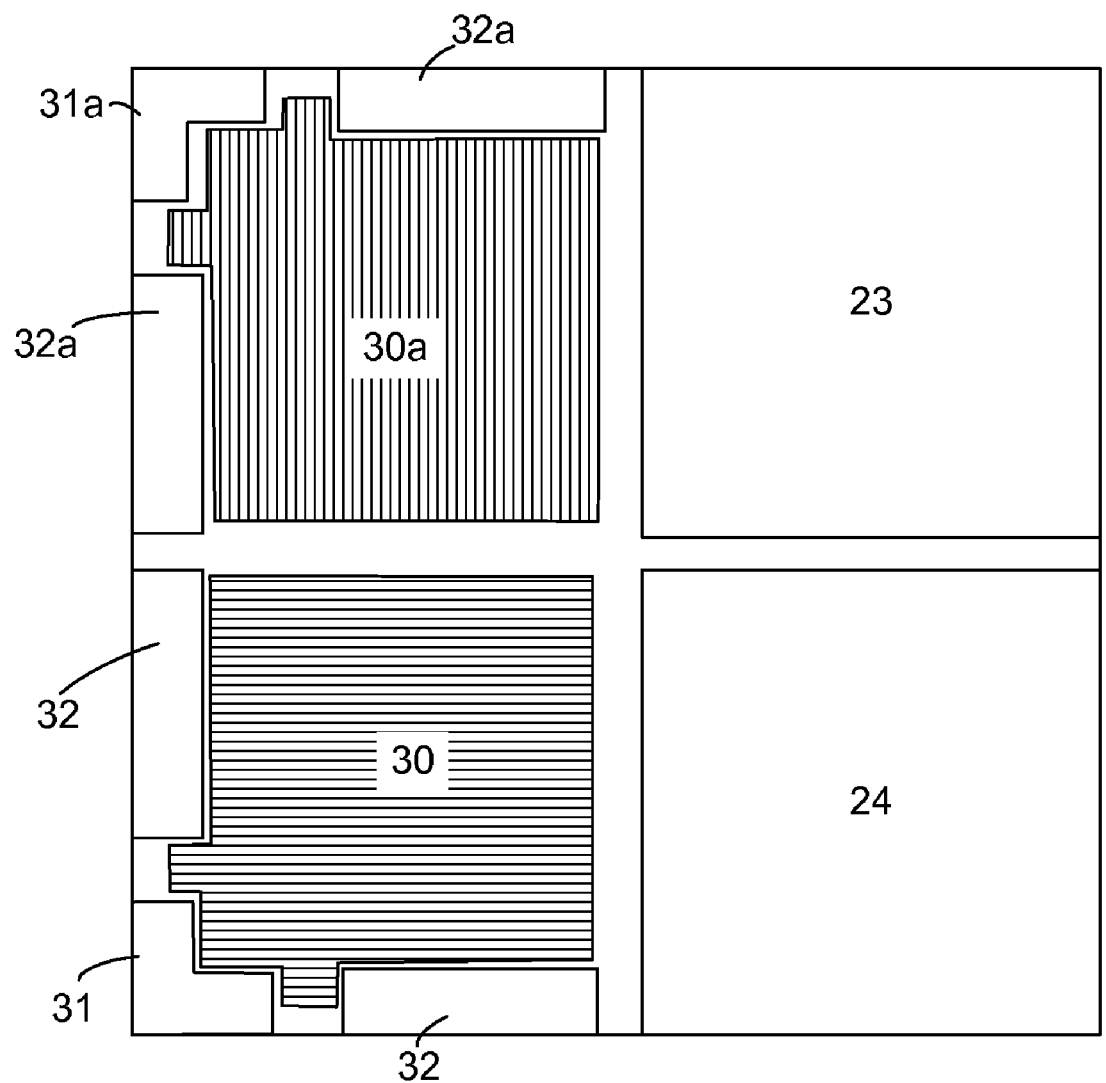
FIG. 4 is a top view of a flip-chip integrated circuit device layout that includes first and second integrated circuit designs and first and second input and output regions in accordance with an embodiment of the present invention.

Referring now to FIG. 4, in step 102 the integrated circuit design 30 is copied, rotated approximately ninety degrees and placed into the second region 22 so as to form integrated circuit design 30a. In the present embodiment the layout of input and output regions 31 and 32 are also copied and rotated approximately ninety degrees to form input and output regions 31a and 32a in second region 22. Thereby the layout in second region 22 will include a design 30a that is identical to integrated circuit design 30 and that is rotated approximately 90 degrees relative to design 30. The layout will also include input and output regions 31a and 32a that are identical to input and output regions 31 and 32 and that are rotated approximately 90 degrees relative to input and output regions 31 and 32.

Figure 5:
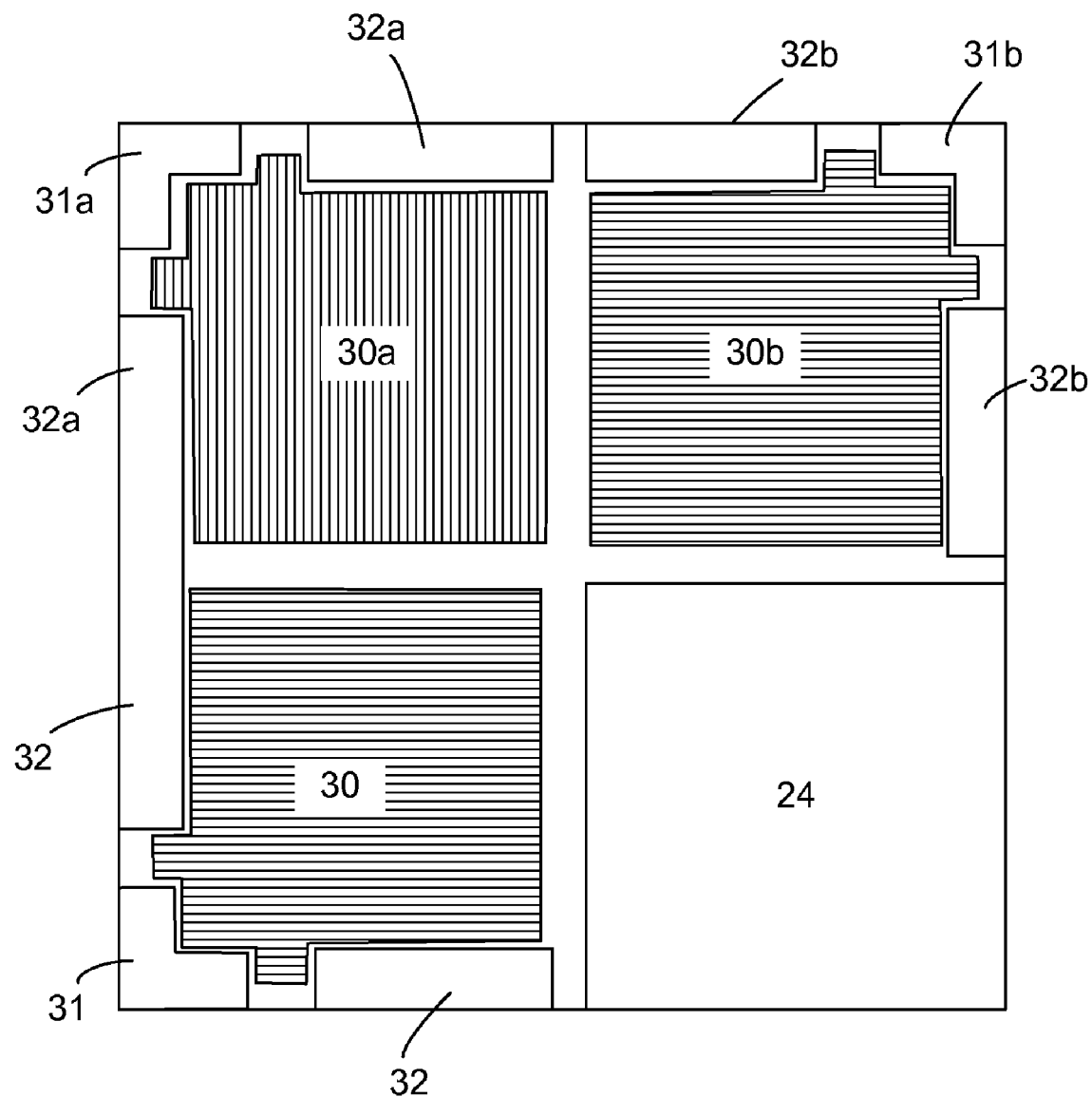
FIG. 5 is a top view of a flip-chip integrated circuit device layout that includes first, second and third integrated circuit designs, and first, second and third input and output regions in accordance with an embodiment of the present invention.

Referring now to FIG. 5, in step 103 the integrated circuit design 30 is copied, rotated, and placed into third region 23 so as to form integrated circuit design 30b. In the present embodiment the layout of input and output regions 31 and 32 are also copied and rotated approximately 180 degrees to form input and output regions 31b and 32b in third region 23. Thereby the layout in third region 23 will include a design 30b that is identical to integrated circuit design 30 and that is rotated approximately 180 degrees relative to design 30. The layout will also include input and output regions 31b and 32b that are identical to input and output regions 31 and 32 and are rotated approximately 180 degrees relative to input and output regions 31 and 32.

Figure 6:
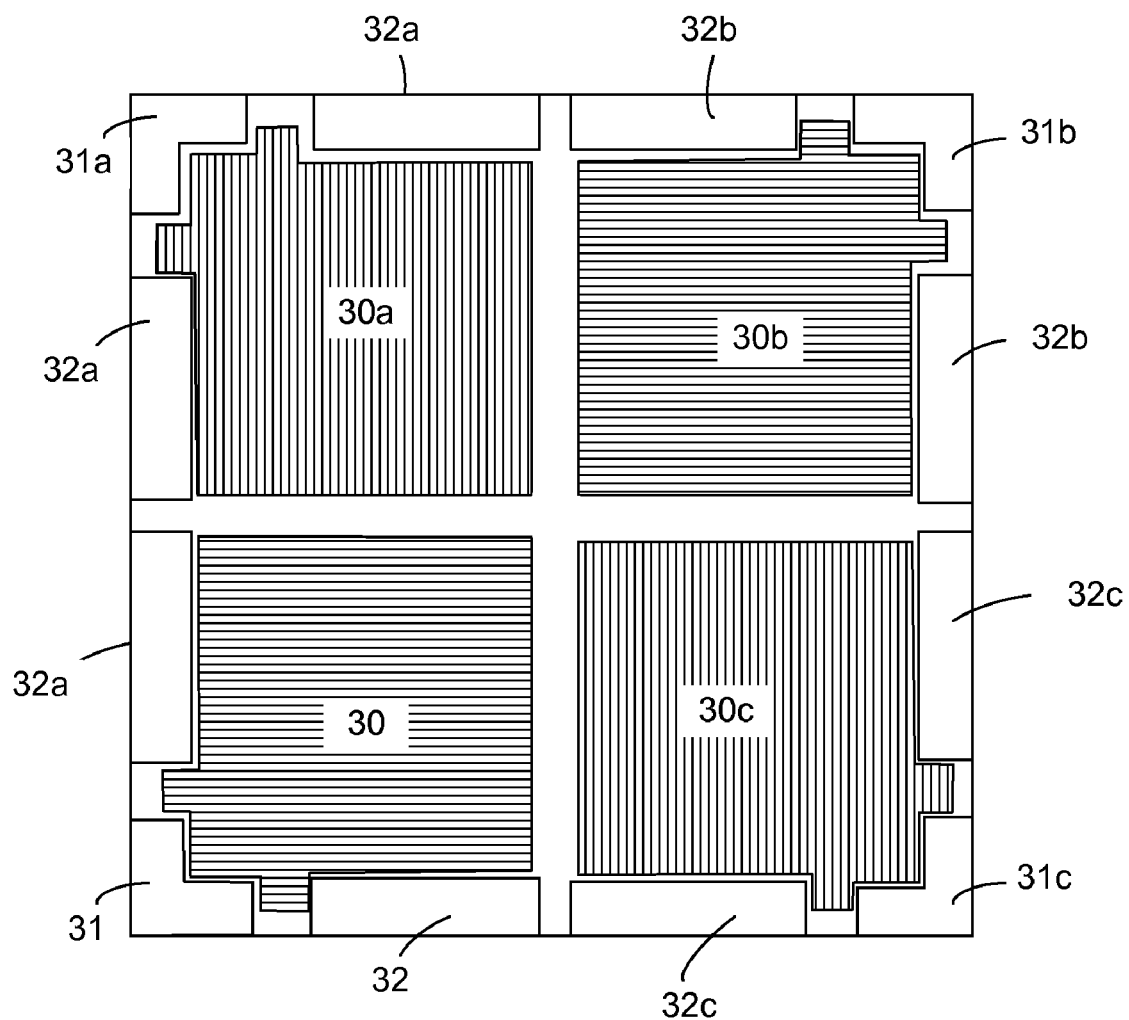
FIG. 6 is a top view of a flip-chip integrated circuit device layout that includes first, second, third and fourth integrated circuit designs, and first, second, third and fourth input and output regions in accordance with an embodiment of the present invention.

Referring now to FIG. 6, in step 104 the integrated circuit design 30 is copied, rotated and placed into the fourth region 24 so as to form integrated circuit design 30c. In the present embodiment the layout of input and output regions 31 and 32 are also copied and rotated approximately 270 degrees to form input and output regions 31c and 32c in fourth region 24. Thereby the layout in fourth region 24 will include a design 30c that is identical to integrated circuit design 30 and that is rotated approximately 270 degrees relative to design 30. The layout will also include input and output regions 31c and 32c that are identical to input and output regions 31 and 32 and are rotated approximately 270 degrees relative to input and output regions 31 and 32.

In the present embodiment because the same integrated circuit design 30 is used, there is no reason to duplicate effort to form integrated circuit designs 30a-30c, input and output layouts 31a-c and 32a-c, saving a considerable amount of time and resources in the design process.

In the present embodiment logic and interconnect structures are then added to the design for operably coupling circuit designs 30-30c together. In the present embodiment these logic and interconnect structures are primarily formed in the space that extends around and between circuit designs 30a-30c. However, portions of the common logic and interconnect can be implemented within input and output regions 31-31- and 32-32c to provide for connection and interoperability of integrated circuit designs 30-30c.

Though FIGS. 3-6 illustrate the use of input and output layouts 31a-c that are identical to input and output layout 31, it is appreciated that, alternatively, one or more of input and output layouts 31a-c can be different from input and output layout 31. In this embodiment the input and output layout 31a-c that is different can be formed by modifying the rotated input and output layout 31. Alternatively, design of input and output layouts 31-31c can be performed after placement of integrated circuit designs 30-30c (steps 101-104), with each input and output layout 31-31c designed independently. Similarly, one or more input and output layouts 32a-c can be different from input and output layout 32. In this embodiment the input and output layout 32a-c that is different can be formed by modifying the rotated input and output layout 32. Alternatively, design of input and output layouts 32-32c can be performed after placement of integrated circuit designs 30-30c (steps 101-104), with each input and output layout 32-32c designed independently.

To provide power and ground connections to the integrated circuit device design a power and ground mesh layer is added to the design. In the present embodiment this power and ground mesh layer includes power and ground strips that are oriented diagonally on a single design layer.

In an alternate embodiment, symmetry by halves is used by creating one design for the NW/SE corners and another for the NE/SW corners. In this case the alternate orientation is derived through a 180 degree rotation, which leaves the preferred route direction unchanged. This provides for power grid simplicity though it results in twice the implementation effort as the method shown and described in FIGS. 1-6.

Figure 7:
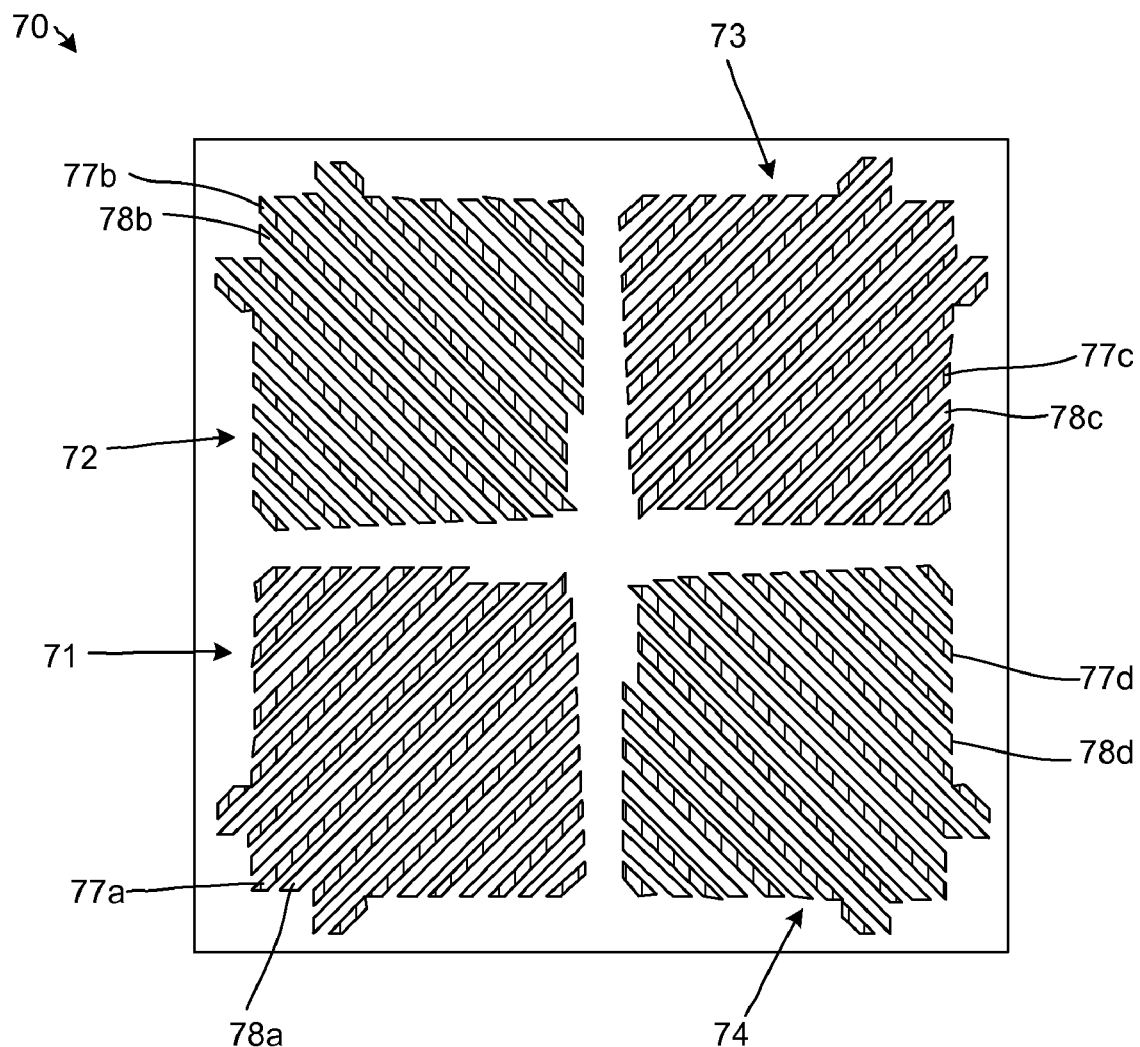
FIG. 7 is a top view of a flip-chip integrated circuit device layout that includes a power and ground mesh having power and ground strips that are oriented diagonally in accordance with an embodiment of the present invention.

FIG. 7 shows an embodiment in which the integrated circuit design layout includes an overlying power and ground mesh layer 70 that includes a first set of power and ground strips 71 that are oriented diagonally relative to the side surfaces of the integrated circuit die. Moreover the first set of power and ground strips are oriented diagonally relative to the orientation of the standard cell layout of integrated circuit design 30. In the present embodiment power and ground strips 71 are oriented at a 45 degree angle relative to the side surfaces of the integrated circuit die and at a 45 degree angle relative to the layout of integrated circuit design 30. In the present embodiment first set of power and ground strips 71 include an alternating pattern of power strips 77a and ground strips 78a that extends within first region 21 such that they overlie integrated circuit design 30. Because power strips 77a and ground strips 78a in the first set of power and ground strips 71 are oriented diagonally and alternate, they provide easy access to power and ground for the circuitry of integrated circuit design 30. Moreover, power and ground are accessible at the top and sides of integrated circuit design 30.

Power and Ground mesh layer 70 includes a second set of power and ground strips 72 that are oriented diagonally relative to the side surfaces of the integrated circuit die. Moreover second set of power and ground strips 72 are oriented diagonally relative to the orientation of the standard cell layout of integrated circuit design 30 and relative to the orientation of the standard cell layout of integrated circuit design 30a. In the present embodiment second set of power and ground strips 72 are oriented at approximately ninety degrees relative to first set of power and ground strips 71. In the present embodiment second set of power and ground strips 72 include an alternating pattern of power strips 77b and ground strips 78b that extend within second region 22 such that they overlie integrated circuit design 30a. Because power strips 77b and ground strips 78b in second set of power and ground strips 72 are oriented diagonally and alternate, they provide easy access to power and ground for the circuitry of integrated circuit design 30a. Moreover, power and ground are accessible at the top and sides of integrated circuit design 30a.

Continuing with FIG. 7, power and ground mesh layer 70 includes a third set of power and ground strips 73 that are oriented diagonally relative to the side surfaces of the integrated circuit die. Moreover third set of power and ground strips 73 are oriented diagonally relative to the orientation of the standard cell layout of integrated circuit design 30 and relative to the orientation of the standard cell layout of integrated circuit design 30b. In the present embodiment third set of power and ground strips 73 are oriented at approximately ninety degrees relative to second set of power and ground strips 72. In the present embodiment third set of power and ground strips 73 includes an alternating pattern of power strips 77c and ground strips 78c that extends within region 23 and overlie integrated circuit design 30b. Because power strips 77c and ground strips 78c in third set of power and ground strips 73 are oriented diagonally and alternate, they provide easy access to power and ground for the circuitry of integrated circuit design 30b. Moreover power and ground are accessible at the top and sides of integrated circuit design 30b.

Power and Ground mesh layer 70 includes a fourth set of power and ground strips 74 that are oriented diagonally relative to the side surfaces of the integrated circuit die. Moreover fourth set of power and ground strips 74 are oriented diagonally relative to the orientation of the standard cell layout of integrated circuit design 30 and relative to the orientation of the standard cell layout of integrated circuit design 30c. In the present embodiment fourth set of power and ground strips 74 are oriented at approximately ninety degrees relative to third set of power and ground strips 73. In the present embodiment fourth set of power and ground strips 74 includes an alternating pattern of power strips 77d and ground strips 78d that extends within region 24 and overlie integrated circuit design 30c. Because power strips 77d and ground strips 78d in fourth set of power and ground strips 74 are oriented diagonally and alternate, they provide easy access to power and ground for the circuitry of integrated circuit design 30c. Moreover power and ground are accessible at the top and sides of integrated circuit design 30c.

In the present embodiment since second set of power and ground strips 72 are rotated at ninety degrees relative to first set of power and ground strips 71, the same via and interconnect placement can be used to couple power and ground to integrated circuit design 30b as is used to couple power and ground to integrated circuit design 30. Similarly, because third set of power and ground strips 73 are rotated 180 degrees relative to first set of power and ground strips 71, the same via and interconnect placement can be used to couple power and ground to integrated circuit design 30*c* as is used to couple power and ground to integrated circuit design 30. Moreover, because fourth set of power and ground strips 74 are rotated at 270 degrees relative to first set of power and ground strips 71, the same via and interconnect placement can be used to couple power and ground to integrated circuit design 30*d* as is used to couple power and ground to integrated circuit design 30.

FIG. 7 shows a first set of power and ground strips 71 that is identical to second set of ground strips 72, third set of ground strips 73 and fourth set of ground strips 74. Moreover, first set of power and ground strips 71 have an identical alternating pattern as compared to second set of ground strips 72, third set of ground strips 73 and fourth set of ground strips 74. However, alternatively, the pattern and shape of one or more of power and ground strips 71-74 could be different.

In one embodiment those power strips 77*a* that are adjacent to a corresponding power strip 77*b* are electrically coupled to the adjacent power strip 77*b*. Also, those power strips 77*b* that are adjacent to a corresponding power strip 77*c* are electrically coupled to the adjacent power strip 77*c*; and power strips 77*c* that are adjacent to a corresponding power strip 77*d* are electrically coupled to the adjacent power strip 77*d*. Also, ground strips 78*a* that are adjacent to a corresponding ground strip 78*b* are electrically coupled to the adjacent ground strip 78*b*. In addition, those ground strips 78*b* that are adjacent to a corresponding ground strip 78*c* are electrically coupled to the adjacent ground strip 78*c*; and ground strips 78*c* that are adjacent to a corresponding ground strip 78*d* are electrically coupled to the adjacent ground strip 78*d*.

Figure 8:
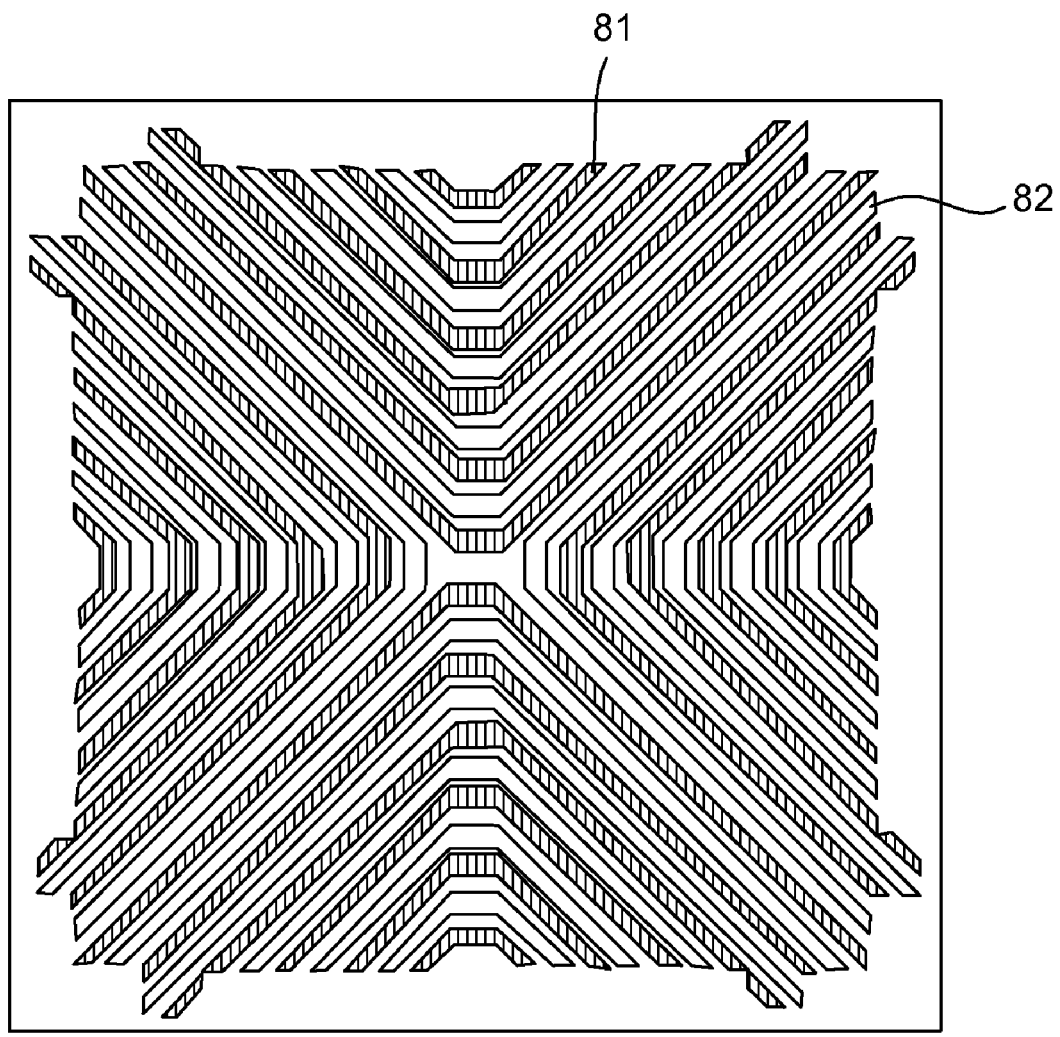
FIG. 8 is a top view of a flip-chip integrated circuit device layout that includes a power and ground mesh having power and ground strips that are oriented diagonally, with each power strip connected to an adjacent power strip and each ground strip connected to an adjacent ground strip in accordance with an embodiment of the present invention.

FIG. 8 shows an exemplary embodiment in which adjacent power strips are coupled together and adjacent ground strips are coupled together to form power strips and ground strips that extend diagonally over integrated circuit designs 30-30*c* and that extend over the channels between integrated circuit designs 30-30*c*. By coupling adjacent power strips together and coupling adjacent ground strips together improved power distribution is obtained, allowing power and ground to be effectively and efficiently distributed to integrated circuit designs 30-30*c* and to the other elements of the integrated circuit design. Moreover, power and ground are easily coupled to the devices in the channels between integrated circuit designs 30-30*c*.

When an integrated circuit device design is completed in accordance with steps 101-105, the integrated circuit device design is used to form integrated circuit devices on a semiconductor wafer as shown by step 106. More particularly, integrated circuit devices are formed on a semiconductor wafer so as to produce a die that includes the structures represented by the design, including the structures in integrated circuit designs 30-30*c*. In the present embodiment a first integrated circuit device is formed corresponding to integrated circuit design 30, a second integrated circuit device is formed corresponding to integrated circuit design 30*a*, a third integrated circuit device is formed corresponding to integrated circuit design 30*b* and a fourth integrated circuit device is formed corresponding to integrated circuit design 30*c*. The die will include conductive layers and dielectric layers that extend over the substrate, and will include a power and ground mesh layer having power and ground strips that are oriented diagonally.

In the present embodiment the power and ground mesh layer is a single layer of metal that is disposed over a dielectric layer. The metal layer is patterned so as to form power and ground strips that are oriented diagonally. In one embodiment the metal layer is patterned so as to form the pattern shown in FIG. 7, with power and ground strips in each set of power and ground strips approximately parallel to each other. In another embodiment the metal layer is patterned so as to form the pattern shown in FIG. 8.

Figure 9:
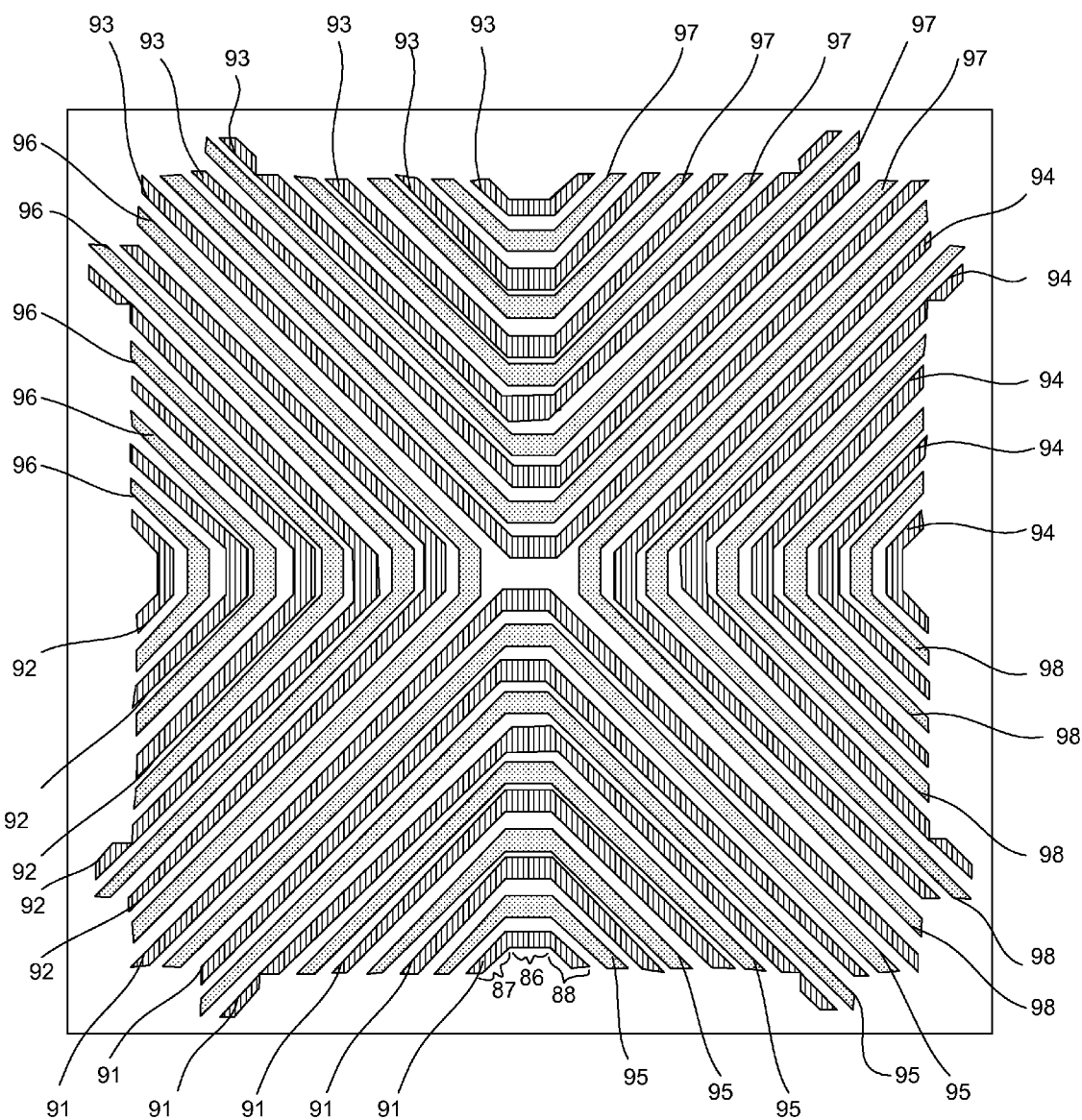
FIG. 9 is a top view of a die region on a semiconductor wafer after a power and ground mesh has been formed thereover in accordance with an embodiment of the present invention.

FIG. 9 shows an exemplary power and ground mesh layer formed on a semiconductor substrate using the design of FIG. 8. In this embodiment the interconnect regions that extend between adjacent ground strips and between adjacent power strips form v-shaped power strips 91-94 and v-shaped ground strips 95-98. Each v-shaped power strip 91-94 and v-shaped ground strip 95-98 will include a central connection region 86, a first angled portion 87 on one end and a second angled portion 88 on the other end. In the present embodiment, the design is symmetrical, with the first angled portion 87 and the second angled portion 88 extending an equal distance from central connection region 86. Moreover, the longitudinal axis of the first angled portion 87 will be at an angle of approximately forty-five degrees relative to the longitudinal axis of central connection region 86 and the longitudinal axis of second angled portion 88 will be at an angle of approximately forty-five degrees relative to the longitudinal axis of central connection region 86. Moreover, the longitudinal axis of first angled portion 87 will be at an angle of approximately ninety degrees relative to the longitudinal axis of second angled portion 88.

The semiconductor fabrication process will form a die that includes a first integrated circuit device in region 21, a second identical integrated circuit device in region 22, a third identical integrated circuit device in region 23, and a fourth identical integrated circuit device in region 24, and other circuitry that extends around and between the integrated circuit devices so that they can function together. The power and ground mesh extends over each of the integrated circuit devices for providing power and ground to underlying integrated circuit devices and to the other circuitry in the integrated circuit design. After patterning the power and ground mesh layer the fabrication process is completed, using conventional processing methods, so as to form a flip-chip integrated circuit die. In one specific embodiment the flip-chip integrated circuit die includes layers that extend over the power and ground mesh that couple the power and ground mesh and the circuitry of input and output regions 31-31*c* and 32-32*c* to a grid array of solder bumps.

Though the methods of the present invention could be used to form any of a number of different devices, in one embodiment a four-port PCI Express switch is formed in region 21, a second four-port PCI Express switch is formed in region 22, a third four-port PCI Express switch is formed in region 23, and a fourth four-port PCI express switch is formed in region 24 of the die. In the present embodiment the PCI Express switch is configurable to operate one or all of the four-port PCI Express switches. More particularly, by activating one four-port PCI Express switch, the die is a four-port PCI Express switch. By activating two adjoining four-port PCI Express switches an eight-port PCI Express switch is obtained. Similarly, by activating three four-port PCI Express switches, the die is a twelve-port PCI Express switch. By activating all four four-port PCI Express switches a sixteen-port PCI Express switch is obtained.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims, not by the above detailed description.

What is claimed is:

1. A method for forming a layout of a semiconductor die comprising:
   disposing a first integrated circuit design in a first region of the semiconductor die layout;
   disposing a second integrated circuit design in a second region of the semiconductor die layout, the second integrated circuit design identical to the first integrated circuit design and rotated approximately ninety degrees relative to the first integrated circuit design;
   disposing a third integrated circuit design in a third region of the semiconductor die layout, the third integrated circuit design identical to the first integrated circuit design and rotated approximately one hundred and eighty degrees relative to the first integrated circuit design;
   disposing a fourth integrated circuit design in a fourth region of the semiconductor die layout, the fourth integrated circuit design identical to the first integrated circuit design and rotated approximately two hundred and seventy degrees relative to the first integrated circuit design; and
   wherein the integrated circuit design layout includes an overlying power and ground mesh layer that includes a first set of v-shaped power and ground strips, a second set of v-shaped power and ground strips, a third set of v-shaped power and ground strips and a fourth set of v-shaped power and ground strips, each of the v-shaped power and ground strips in the first set of v-shaped power and ground strips, the second set of v-shaped power and ground strips, the third set of v-shaped power and ground strips and the fourth set of v-shaped power and ground strips including a central connection region, a first angled portion on one end and a second angled portion on the other end, wherein each first angled portion and second angled portion that extends over the first integrated circuit device is oriented at an angle of approximately forty five degrees relative to the layout of the first integrated circuit device, and each first angled portion and second angled portion that extends over the second integrated circuit device is oriented approximately perpendicular to each first angled portion and second angled portion that extends over the first integrated circuit device.

2. A method as recited in claim 1 wherein the first set of v-shaped power and ground strips comprises alternating power and ground strips, the second set of v-shaped power and ground strips comprises alternating power and ground strips, the third set of v-shaped power and ground strips comprises alternating power and ground strips and the fourth set of v-shaped power and ground strips comprises alternating power and ground strips.

3. A method as recited in claim 2 further comprising:
   disposing a first input and output region in the first region;
   disposing a second input and output region in the second region, the layout of the second input and output region identical to the layout of the first input and output region and rotated ninety degrees relative to the layout of the first input and output region;
   disposing a third input and output region in the third region, the layout of the third input and output region identical to the layout of the first input and output region and rotated one hundred and eighty degrees relative to the first input and output region;
   disposing a fourth input and output region in the fourth region, the layout of the fourth input and output region identical to the layout of the first input and output region and rotated at two hundred and seventy degrees relative to the first input and output region.

4. A semiconductor die comprising:
   a first integrated circuit device in a first region of the semiconductor die;
   a second integrated circuit device in a second region of the semiconductor die, the second integrated circuit device rotated approximately ninety degrees relative to the first integrated circuit device;
   a third integrated circuit device in a third region of the semiconductor die, the third integrated circuit device rotated approximately one hundred and eighty degrees relative to the first integrated circuit device;
   a fourth integrated circuit device in a fourth region of the semiconductor die, the fourth integrated circuit device rotated approximately two hundred and seventy degrees relative to the first integrated circuit device, the first integrated circuit device, the second integrated circuit device the third integrated circuit device and the fourth integrated circuit device operably coupled together; and
   a power and ground mesh layer that includes a first set of v-shaped power and ground strips, a second set of v-shaped power and ground strips, a third set of v-shaped power and ground strips and a fourth set of v-shaped power and ground strips, each of the v-shaped power and ground strips in the first set of v-shaped power and ground strips, the second set of v-shaped power and ground strips, the third set of v-shaped power and ground strips and the fourth set of v-shaped power and ground strips including a central connection region, a first angled portion on one end and a second angled portion on the other end, wherein each first angled portion and second angled portion that extends over the first integrated circuit device is oriented at an angle of approximately forty five degrees relative to the layout of the first integrated circuit device, and each first angled portion and second angled portion that extends over the second integrated circuit device is oriented approximately perpendicular to each first angled portion and second angled portion that extends over the first integrated circuit device.

5. The semiconductor die of claim 4 wherein the layout of the second integrated circuit device is identical to the layout of the first integrated circuit device and rotated relative to the layout of the first integrated circuit device, the layout of the third integrated circuit device is identical to the layout of the first integrated circuit device and rotated relative to the layout of the first integrated circuit device, and the layout of the fourth integrated circuit device is identical to the layout of the first integrated circuit device and rotated relative to the layout of the first integrated circuit device.

6. The semiconductor die of claim 4 wherein the layout of the second integrated circuit device is oriented at approximately ninety degrees relative to the layout of the first integrated circuit device, the layout of the third integrated circuit device is oriented at approximately one hundred and eighty degrees relative to the layout of the first integrated circuit device, and the layout of the fourth integrated circuit device is oriented at approximately two hundred and seventy degrees relative to the layout of the first integrated circuit device.

7. The semiconductor die of claim 4 wherein each first angled portion and second angled portion that extends over the third integrated circuit device is oriented approximately perpendicular to each first angled portion and second angled portion that extends over the second integrated circuit device, and each first angled portion and second angled portion that extends over the fourth integrated circuit device is oriented approximately perpendicular to each first angled portion and second angled portion that extends over the third integrated circuit device.

8. The semiconductor die of claim 7 wherein the first integrated circuit device, the second integrated circuit device the third integrated circuit device and the fourth integrated circuit device together form a PCI express switch.

9. The semiconductor die of claim 7 wherein the first integrated circuit device, the second integrated circuit device, the third integrated circuit device and the fourth integrated circuit device comprise a sixteen-port PCI express switch.

* * * * *